United States Patent
Déjardin

(10) Patent No.: US 10,530,508 B2
(45) Date of Patent: Jan. 7, 2020

(54) METHOD FOR AUTOMATIC PRODUCTION OF A SERVICE PLAN

(71) Applicant: SAGEMCOM BROADBAND SAS, Rueil Malmaison (FR)

(72) Inventor: Romain Déjardin, Paris (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 16/343,106

(22) PCT Filed: Sep. 14, 2017

(86) PCT No.: PCT/EP2017/073197
§ 371 (c)(1),
(2) Date: Apr. 18, 2019

(87) PCT Pub. No.: WO2018/072938
PCT Pub. Date: Apr. 26, 2018

(65) Prior Publication Data
US 2019/0319727 A1   Oct. 17, 2019

(30) Foreign Application Priority Data

Oct. 18, 2016 (FR) .................................. 16 60097

(51) Int. Cl.
| | |
|---|---|
| *H04N 5/445* | (2011.01) |
| *H04H 60/41* | (2008.01) |
| *H03J 7/18* | (2006.01) |
| *H04N 21/438* | (2011.01) |
| *H04N 5/50* | (2006.01) |
| *H04N 21/426* | (2011.01) |

(52) U.S. Cl.
CPC .............. *H04H 60/41* (2013.01); *H03J 7/183* (2013.01); *H04N 5/50* (2013.01);
(Continued)

(58) Field of Classification Search
CPC ....................... H04N 21/4263; H04N 21/4383
(Continued)

(56) References Cited

U.S. PATENT DOCUMENTS

| | | | | |
|---|---|---|---|---|
| 7,944,512 B2* | 5/2011 | Miyazaki | ............. | H04N 21/235 348/731 |
| 8,837,641 B2* | 9/2014 | Shirasuka | ............ | H04N 5/4401 375/240.01 |

(Continued)

FOREIGN PATENT DOCUMENTS

| | | |
|---|---|---|
| EP | 1 838 096 A2 | 9/2007 |
| EP | 2 770 437 A1 | 8/2014 |

(Continued)

OTHER PUBLICATIONS

International Search Report as issued in International Patent Application No. PCT/EP2017/073197, dated Oct. 24, 2017.

(Continued)

*Primary Examiner* — Michael B. Pierorazio

(74) *Attorney, Agent, or Firm* — Pillsbury Winthrop Shaw Pittman LLP

(57) ABSTRACT

A method for scanning a frequency band for producing a service plan. The method parallelises the scanning by dividing the analysis into two steps: an exploration step for the purpose of detecting channels or frequencies carrying services; and an analysis step for extracting detected channels from program information in order to supply a service plan. Each of the steps is performed by multiple task instances. These tasks share the band to be explored and synchronise, for one same step, via semaphores and, for an inter-step communication, according to a producer/consumer principle.

11 Claims, 2 Drawing Sheets

(52) U.S. Cl.
CPC ..... *H04N 21/4263* (2013.01); *H04N 21/4383* (2013.01); *H04H 2201/60* (2013.01)

(58) Field of Classification Search
USPC .......................................................... 725/38
See application file for complete search history.

(56) References Cited

U.S. PATENT DOCUMENTS

| | | | | |
|---|---|---|---|---|
| 9,380,251 | B2* | 6/2016 | Kang | H04N 5/46 |
| 2005/0037721 | A1* | 2/2005 | Benz | H03J 1/0083 |
| | | | | 455/187.1 |
| 2006/0288393 | A1* | 12/2006 | Park | H04N 5/4401 |
| | | | | 725/100 |
| 2013/0136212 | A1* | 5/2013 | Shirasuka | H04N 5/4401 |
| | | | | 375/340 |

FOREIGN PATENT DOCUMENTS

| | | |
|---|---|---|
| JP | 2003-333441 A | 11/2003 |
| WO | WO 2009/018766 A1 | 2/2009 |

OTHER PUBLICATIONS

Written Opinion of the International Searching Authority as issued in International Patent Application No. PCT/EP2017/073197, dated Oct. 24, 2017.

* cited by examiner

METHOD FOR AUTOMATIC PRODUCTION OF A SERVICE PLAN

CROSS REFERENCE TO RELATED APPLICATIONS

This application is the U.S. National Stage of PCT/EP2017/073197, filed Sep. 14, 2017, which in turn claims priority to French Patent Application No. 1660097 filed Oct. 18, 2016, the entire contents of all applications are incorporated herein by reference in their entireties.

FIELD OF THE INVENTION

The object of the invention is a method for automatic production of a service plan. The field of the invention is that of television decoder units, also called "set top boxes" or simply "boxes". Such a unit is an intermediate device between a programme broadcast and the restitution of the said programme in the form of a video, i.e. between the broadcaster and the screen. In practice it can be incorporated in the television.

More specifically, the field of the invention is that of automatic configuration of such devices.

STATE OF THE PRIOR ART

The problem described here corresponds to the case of a multi-channel digital TV/radio signal reception device, where there is in principle no knowledge of the distribution of frequencies and of the services associated with them. In this context it is habitual to blind-test each sub-band of the usable, available frequency band in order to detect the presence of a signal providing TV/radio services. When a signal has been detected and its physical layer parameters identified, the data must then be retrieved from the binary stream giving the services provided by the channel. This sequential detection and retrieval enable a global service plan to be obtained (i.e. the list of services) associated with each frequency channel discovered during the scan.

Scanning is thus undertaken service-by-service, which takes a very long time, and gives the impression of a blocked signal reception device. The wait period last several tens of minutes. The only existing solution is to display of a progress bar, to show a user that the device is in the process of undertaking a long task.

This problem is particularly substantial since scanning must be undertaken each time a new service appears.

ACCOUNT OF THE INVENTION

The invention seeks to remedy all or a proportion of the disadvantages of the state of the art identified above, and in particular to propose means to enable the user experience to be improved.

To reduce scanning time the invention teaches a method which:
- dissociates the steps of discovery of the frequency channels and the steps of retrieval of the associated services, and
- performs the discovery and retrieval in parallel.

The aim is to be able to accelerate full scanning and completion of the service plan.

This approach exploits to the full the receivers (also called the "front-end") contained in the decoder unit devices.

With this intention, one aspect of the invention relates to a method for automatic production of a service plan of a decoder unit device, where the said decoder unit device includes a plurality of receivers and records the service plan produced in a configuration memory after the following steps are implemented:

distribution of the receivers into two groups, where each group is dedicated to one task:
  a first group of receivers is dedicated to a task of exploration of a frequency band to be explored, where the lower limit and the upper limit of the band are known, an exploration task instance fills a list of service-carrier frequencies, the exploration task instances are synchronised with one another via a first semaphore protecting a value of a nearby frequency to be explored, and an exploration task instance stops if the value of a nearby frequency to be explored is higher than the upper limit of the frequency band to be explored;
  a second group of receivers is dedicated to a task of analysis of the frequencies in the list of service-carrier frequencies, an analysis task instance fills a table of services, the analysis task instances are synchronised with one another via a second semaphore protecting an identifier of a nearby frequency to be analysed, and an analysis task instance stops if the list of service-carrier frequencies is empty and if the value of the next frequency to be explored is higher than the upper limit of the frequency band;
creation of task instances according to the distribution of receivers, where each distributed receiver is associated with a task according to its group, and the task instances are performed in parallel;
provision of the service table produced to update the configuration memory.

In addition to the main characteristics which have just been mentioned in the preceding paragraph, the method according to the invention may have one or more of the following possible additional characteristics, considered individually or in technically possible combinations:

an exploration task instance includes the following steps:
  setting of the first semaphore,
  assignment of a current frequency to be explored of the task instance by the value of the next frequency to be explored,
  update of the value of the next frequency to be explored as a function of the value of the current frequency to be explored,
  release of the first semaphore,
  evaluation of the stop condition of an exploration task,
  exploration of the current frequency to be explored,
  if the current frequency to be explored includes a service, then updating of the table of frequencies to be analysed.

an analysis task instance includes the following steps:
  evaluation of the stop condition of an analysis task,
  setting of the second semaphore,
  assignment of a current frequency to be analysed of the task instance by the value of the next frequency to be analysed,
  update of the value of the next frequency to be analysed as a function of the value of the current frequency to be analysed,
  release of the second semaphore,
  if there is a frequency to be analysed:
  analysis of the current frequency to be analysed,
  update of the service table.

an explored frequency is considered to have no services if the exploration lasts for more than a predetermined end-of-exploration wait time.

the end-of-exploration wait time is equal to twice the time allowing detection of a service, if a service is indeed present.

when the exploration is ended the receivers of the first group are attributed to the second group and analysis task instances are attributed to them.

if the decoder unit device includes K receivers, the first group includes K/2 receivers, and the second group includes K/2 receivers.

if the decoder unit device includes K receivers, the first group includes N receivers and the second group includes M receivers, where M=K−N, and $$N = K * \frac{(L*tE + P*tO)}{2*L*tE + L*tA + P*tO}$$

where:
L: the estimated number of service-carrier frequencies
P: the estimated number of non-service-carrier frequencies
tE: the exploration time of a service-carrier frequency
tO: the exploration time of a non-service-carrier frequency
tA: the analysis time of a frequency Another object of the invention is a device for automatic production of a service plan where the said device includes a plurality of receivers, and records the produced service plan in a configuration memory, where the production device includes processing and recording means, and where the said means are designed:

to distribute receivers of the plurality of receivers into two groups, where each group is dedicated to one task:

a first group of receivers is dedicated to a task of exploration of a frequency band to be explored, where the lower limit and the upper limit of the band are known, an exploration task instance fills a list of service-carrier frequencies, the exploration task instances are synchronised with one another via a first semaphore protecting a value of a nearby frequency to be explored, and an exploration task instance stops if the value of a nearby frequency to be explored is higher than the upper limit of the frequency band to be explored;

a second group of receivers is dedicated to a task of analysis of the frequencies in the list of service-carrier frequencies, an analysis task instance fills a table of services, the analysis task instances are synchronised with one another via a second semaphore protecting an identifier of a nearby frequency to be analysed, and an analysis task instance stops if the list of service-carrier frequencies is empty and if the value of the next frequency to be explored is higher than the upper limit of the frequency band;

to create task instances according to the distribution of receivers, where each distributed receiver is associated with a task according to its group, and the task instances are performed in parallel;

to provide the service table produced to update the configuration memory.

Another object of the invention is a non-transient memory device including instruction codes to implement a method according to a possible combination of previously described steps.

Another object of the invention is a computer program product including instructions which, when the program is executed by computer, cause the latter to implement the steps of the method according to a possible combination of previously described steps.

BRIEF DESCRIPTION OF THE FIGURES

Other characteristics and advantages of the invention will be seen clearly on reading the description below, with reference to the appended figures, which illustrate.

For greater clarity, identical or similar elements are identified by identical reference signs in all the figures.

The invention will be better understood on reading the description which follows, and on examining the figures accompanying it. These are shown as an indication only, and are not restrictive of the invention in any manner.

DETAILED DESCRIPTION

Figure 1:
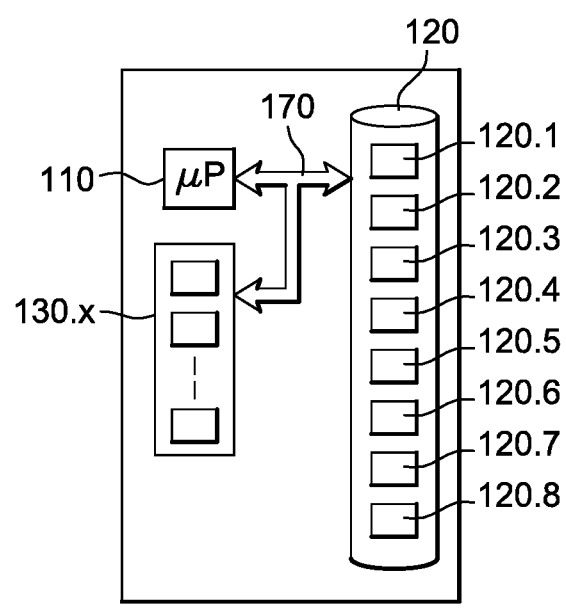
in FIG. 1, a diagrammatic representation of material means allowing the method according to the invention to be implemented.

FIG. 1 shows a decoder unit device 100. Decoder unit 100 includes:

a microprocessor 110. These are processing means represented in a simplified manner. A decoder unit may include several microprocessors with, for example, one microprocessor dedicated to image processing (principally decompression);

storage means 120, for example a hard drive, whether local or remote, and whether simple or in a schema (for example RAID), or a memory chip;

a plurality of receivers 130.X. A receiver is, for example, a set of means designed to process an analogue signal received via an antenna. For the purposes of the description it is considered that decoder unit 100 includes K receivers, and that K is greater than or equal to two.

Means designed to process an analogue signal are, for example, a demodulator circuit producing a frame of bits, where the demodulator circuit is followed by a decoding circuit for processing the frame. Such a decoding circuit is, for example, an MPEG decoder. In the field such a receiver is called a "Front-End". The term "tuner" is also used.

FIG. 1 shows that microprocessor 110 of the decoder unit, storage means 120 of the decoder unit and receivers 130.X are interconnected by a bus 170.

FIG. 1 shows that storage means 120 include several zones. FIG. 1 shows that storage means 120 include:

a zone 120.1 including instruction codes to implement the method according to the invention;

a zone 120.2 including a description of a frequency band to be explored;

a "next exploration" zone 120.3 including a value of the next frequency to be explored;

a zone 120.4 including a list of frequencies to be analysed. A list is a memory structure which enables a plurality of data of the same kind to be recorded. The structure of the list itself is not important; what is important in this case is that it enables a buffer to be created between a process which fills the list and a process which empties the list. Filling is the result of an exploration of the frequency band. Emptying is the result of an analysis of the detected frequencies.

a zone 120.5 including a value of the next frequency to be analysed;

a zone 120.6 including a table of discovered services. A table is a memory structure. It is used as an intermediate structure between the method according to the invention and a decoder unit device implementing the said method. Its structure is not important. Such a table is however designed to be compatible with the metadata conveyed by MPEG-type audio/video streams. This metadata is information specific to a programme. In particular such a table enables data corresponding to a programme association table (also called a "PAT table"), as defined by the MPEG standard, to be recorded. This table is merely an example. The principles of the invention remain valid with other service table structures;

a zone 120.7 including values for configuration parameters of the method according to the invention, for example a value for a wait time (the term "timeout" is also used), after which it is considered that an exploration will not be successful, i.e. that there is no service in the explored frequency;

a zone 120.8 including the service plan of the decoder unit device.

When an action is imparted to a device it is in fact performed by a microprocessor of the device controlled by instruction codes recorded in a memory of the device. If an action is imparted to an application it is in fact performed by a microprocessor of the device in a memory where the instruction codes for the application are recorded. When a device or an application transmits or receives a message this message is transmitted or received via a communication interface of the said device or of the said application.

Figure 2:
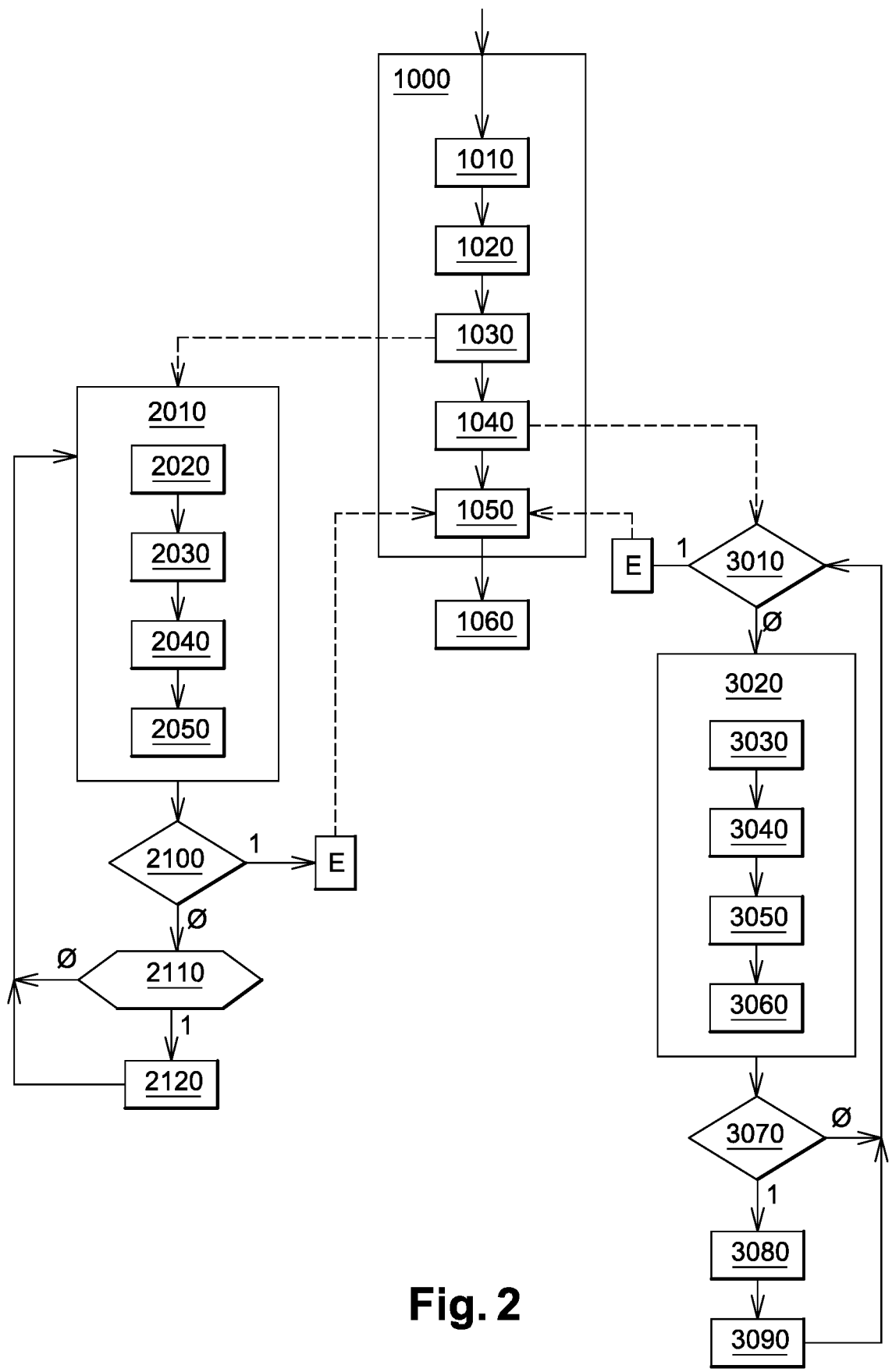
in FIG. 2, an illustration of steps of the method according to the invention.

FIG. 2 shows a preliminary step 1000 in which a user of decoder unit 100 uses a man-machine interface of decoder unit 100 to activate a frequency scan. In preliminary step 1000 the decoder unit configures the method according to the invention and undertakes the following sub-steps:

distribution 1010 of the K receivers into two groups:
where a first group contains N receivers,
where a second group contains M receivers, writing 1020 of the next frequency to be explored, where this value is read in zone 120.2 of description of the frequency band to be explored. In particular, the lower limit of the frequency band is used to initialise the value of the next frequency to be explored.

creation 1030 of exploration task instances: one instance for each receiver of the first group, creation 1040 of analysis task instances: one instance for each receiver of the second group.

wait 1050 for all created task instances to have finished their execution.

In the distribution into two groups, since a receiver can belong only to a single group, the following equation applies:

$$N+M<=K.$$

In practice each receiver is associated with a unique identifier for decoder unit 100, and the distribution is then the production of two lists of identifiers in the working memory.

The creation of a task instance conventionally includes the following steps:

allocation of execution resources, i.e. at least one memory zone and computation time in microprocessor 110, thereby forming an execution context;

attribution to the context of an entry point for a program to be run;

submission of the context to a multitask sequencing engine.

At the end of step 1040 the decoder unit is thus hosting N+M active tasks which are being executed in parallel.

FIG. 2 shows a step 2010 of acquisition of the next frequency to be explored. This step is the first step of a frequency exploration task. Step 2010 of acquisition of the next frequency to be explored includes the following sub-steps:

setting 2020 of a first semaphore, reading 2030 of the content of the next exploration zone and allocation of the read value to a variable local to the task instance, where this variable is the current frequency of the task instance, update 2040 of the content of the next exploration zone according to the current frequency;

release 2050 of the first semaphore;

Use of a first semaphore allows the exploration tasks to be synchronised in an orderly manner. This guarantees that two concurrent exploration tasks:

do not explore the same frequency;

do not update the next exploration zone at the same time.

The content of the next exploration zone is updated, for example, by incrementing the current value of a predetermined interval. This interval is such that two exploration tasks each having their current frequency value do not overlap. This interval can also be arbitrary.

If the distribution standard stipulates the width, or bandwidth, of the useful signal, for example in DVBT, then the predetermined interval is in fact determined by using the current frequency, to which half the bandwidth of the useful signal is added. Otherwise, the bandwidth is determined by iteration of successive tests (for example in DVBS) and then corrected after the FE [frequency to be explored] is locked (which allows an overlap of several MHz) to determine the bandwidth of the useful signal.

Step 2010 of acquisition of the next frequency to be explored is followed by a step 2100 of evaluation of a stop condition of the exploration task. If this condition is validated the task then stops. Otherwise, step 2110 of exploration of the current frequency is performed. The stop condition of an exploration task is true, i.e. validated, if the current frequency value is higher than the upper limit of the frequency band to be explored. This upper limit is known by reading the content of zone 120.2 of description of the frequency band to be explored.

In step 2110 an attempt is made to detect whether the explored frequency includes a service. There are at least two ways of proceeding:

is the frequency a power-carrier frequency, or does a decoding attempt produce a valid frame?

Whichever detection method is chosen, it is attempted at most for a detection wait time, or detection timeout. This wait time is also equal, conventionally, to twice the time required for the detection to conclude that a service is present, if indeed a service is present. Conventionally this wait time is equal to 400 ms. If no service is detected then step 2010 of acquisition of the next frequency to be explored is performed. Otherwise step 2120 of insertion of a frequency to be analysed in list 120.4 of the frequencies to be analysed is performed. At the end of step 2120 of insertion of a frequency to be analysed step 2010 of acquisition of the next frequency to be explored is performed.

In the step of insertion of a frequency to be analysed the analysis task instance creates a record of a frequency to be analysed, including at least the value of the frequency having enabled the detection. This frequency is the central frequency of the detected channel.

The exploration tasks thus produce records of frequencies to be analysed. A record of a frequency to be analysed is a memory structure allowing the description of the frequency to be analysed. These records are then consumed by analysis tasks.

FIG. 2 shows a step 3010 of evaluation of a stop condition of an analysis task. This step is the first step of a frequency analysis task. Such a condition is that the list of frequencies to be analysed is empty and all the exploration tasks are stopped. This second condition can also be: the value of the next frequency to be explored is higher than the upper limit of the frequency band to be explored. If this condition is validated the task then ends. Otherwise, a step 3020 of acquisition of the next frequency to be analysed is performed.

The zone including the next frequency to be analysed is protected by a second semaphore.

This zone can contain an identifier of a frequency in the list of the frequencies to be analysed, or a pointer. This zone can also be merely a semaphore which protects a call to a function to recover the frequency from the list of frequencies to be analysed. This recovery frequency is thus available only for one task instance at any one time, which guarantees satisfactory management of concurrency for the analysis of the frequencies. There are therefore several implementations to ensure that a given frequency is not analysed several times.

Step 3020 thus includes the following sub-steps:
setting 3030 of a second semaphore,
assignment 3040 of a current frequency to be analysed of the task instance by the value of the next frequency to be analysed,
update 3050 of the value of the next frequency to be analysed as a function of the value of the current frequency to be analysed,
release 3060 of the second semaphore, In one variant only a single semaphore is used, i.e. the same semaphore for both tasks.

In a step 3070 following step 3020 of acquisition of the next frequency to be explored, if there is no frequency, i.e. the list of frequencies to be explored is empty, since the exploration tasks do not find any, step 3010 of evaluation of a stop condition of the analysis task is then performed. Otherwise, if there is a frequency to be analysed a step 3080 of analysis of the frequency is performed. Such a step of analysis amounts to allowing the decoder to perform its work, for the current frequency, as with conventional scanning. At the end of the analysis data has therefore been produced which enables a service table to be updated. I.e. the creation, in a step 3090, of a new record in zone 120.6 table of discovered services. At the end of update step 3090 step 3010 of evaluation of a stop condition of an analysis task is performed.

With another formulation, in the invention, an analysis task remains active while a new frequency to be explored may be added to the list of frequencies to be analysed. There is therefore a double stop condition of an analysis task:
the list of frequencies to be analysed is empty, and
all the exploration tasks have stopped.

After step 1050, when all the tasks according to the invention are ended, a step 1060 is performed, to provide the table of discovered services produced in the decoder unit which uses it to update a configuration memory which is used to control the said unit. In particular such a configuration memory is used to browse amongst the services, i.e. the television channels.

With the invention this configuration memory can be filled ten times more rapidly than before the invention. The principle of the invention is therefore to divide the discovery process into two steps:
a step of exploration to detect the presence of a service,
a step of analysis to analyse the services.

The invention also exploits to the full the capacities of the decoder unit by implementing these steps in parallel.

In a variant of the invention the second semaphore is used in the exploration tasks to protect the access points to the list of tasks to be analysed.

In a variant of the invention, as soon as the evaluation of a stop condition of an exploration task is true, the corresponding receiver of the group is then changed, and a new analysis task instance is created with this receiver. I.e. in fact as soon as exploration is ended.

In a variant of the invention the values of N and M are optimised. Simple implementations are:
N=M=K/2, or
N=⅓ *K, M=K−N, based on the principle that exploration is faster than analysis.

In a more complex variant N and M are optimised with the following formula: M=K−N, and $$N = K * \frac{(L*tE + P*tO)}{2*L*tE + L*tA + P*tO}$$

where:
L: the estimated number of service-carrier frequencies
P: the estimated number of non-service-carrier frequencies
tE: the exploration time of a service-carrier frequency
tO: the exploration time of a non-service-carrier frequency
tA: the analysis time of a frequency
All the time periods are expressed in the same unit, for example milliseconds.

This formula is based on an estimate of the number of service-carrier frequencies in the frequency band to be explored and of the number of non-service-carrier frequencies. Use of this formula maximises the number of receivers used for the analysis. This maximisation tries to make the exploration and analysis task instances end at the same time, to the nearest analysis task duration period.

In the formula a term L*(tE+tA) is seen in the divisor, since the analysis of the frequency re-performs all the steps of a conventional scan, which includes locking of a channel for a period L*tE.

Use of this approach maximises the performance of the method according to the invention.

With this approach N is thus set to a value different to M, where the values of N and M are optimised starting from the observation that the maximum exploration time is equal, with the previously used definitions, to:

max(((L*tE)+(P*tO))/N; L*(tE+tA)/M)

The invention obviously remains valid if arbitrary values of N and M are chosen, or values dependent on other considerations.

The invention claimed is:
1. A method for automatic production of a service plan of a decoder unit device, wherein the decoder unit device includes a plurality of receivers and records the service plan produced in a configuration memory after the following steps are implemented:

distributing the receivers into two groups, where each group is dedicated to one task:

a first group of receivers is dedicated to a task of exploration of a frequency band to be explored, where a lower limit and an upper limit of the band are known, an exploration task instance fills a list of service-carrier frequencies, the exploration task instances are synchronised with one another via a first semaphore protecting a value of a nearby frequency to be explored, and an exploration task instance stops if the value of a nearby frequency to be explored is higher than the upper limit of the frequency band to be explored;

a second group of receivers is dedicated to a task of analysis of the frequencies in the list of service-carrier frequencies, an analysis task instance fills a table of services, the analysis task instances are synchronised with one another via a second semaphore protecting an identifier of a nearby frequency to be analysed, and an analysis task instance stops if the list of service-carrier frequencies is empty and if the value of the next frequency to be explored is higher than the upper limit of the frequency band;

creating task instances according to the distribution of receivers, where each distributed receiver is associated with a task according to its group, and the task instances are performed in parallel;

provisioning the service table produced to update the configuration memory.

2. The method for automatic production of a service plan according to claim 1, wherein an exploration task instance includes:

setting of a first semaphore, assigning a current frequency to be explored of the task instance by the value of the next frequency to be explored, updating the value of the next frequency to be explored as a function of the value of the current frequency to be explored, releasing the first semaphore;

evaluating the stop condition of an exploration task, exploring the current frequency to be explored, if the current frequency to be explored includes a service, then updating the table of frequencies to be analysed.

3. The method for automatic production of a service plan according to claim 1 wherein an analysis task instance includes:

evaluating the stop condition of an analysis task, setting the second semaphore, assigning a current frequency to be analysed of the task instance by the value of the next frequency to be analysed, updating the value of the next frequency to be analysed as a function of the value of the current frequency to be analysed, releasing the second semaphore, if there is a frequency to be analysed:

analyzing the current frequency to be analysed, updating the service table.

4. The method for automatic production of a service plan according to claim 1, wherein an explored frequency is considered not to have a service if the exploration lasts for more than a predetermined end-of-exploration wait time.

5. The method for automatic production of a service plan according to claim 4, wherein the end-of-exploration wait time is equal to twice the time allowing detection of a service, if a service is indeed present.

6. The method for automatic production of a service plan according to claim 1, wherein when the exploration is ended the receivers of the first group are attributed to the second group and analysis task instances are attributed to them.

7. The method for automatic production of a service plan according to claim 1, wherein, if the decoder unit device includes K receivers, the first group includes K/2 receivers and the second group includes K/2 receivers.

8. The method for automatic production of a service plan according to claim 1, wherein, if the decoder unit device includes K receivers, the first group includes N receivers and the second group includes M receivers, where M=K−N, and $$N = K * \frac{(L*tE + P*tO)}{2*L*tE + L*tA + P*tO}$$

where:

L: the estimated number of service-carrier frequencies

P: the estimated number of non-service-carrier frequencies tE: the exploration time of a service-carrier frequency tO: the exploration time of a non-service-carrier frequency tA: the analysis time of a frequency.

9. A non-transitory memory device including instruction codes for the implementation of a method according to claim 1.

10. A device for automatic production of a service plan, the device comprising a plurality of receivers, and records the produced service plan in a configuration memory, wherein the production device includes processing and recording means, and wherein the means are arranged to distribute receivers of the plurality of receivers into two groups, wherein each group is dedicated to one task:

a first group of receivers is dedicated to a task of exploration of a frequency band to be explored, wherein a lower limit and an upper limit of the band are known, an exploration task instance fills a list of service-carrier frequencies, the exploration task instances are synchronised with one another via a first semaphore protecting a value of a nearby frequency to be explored, and an exploration task instance stops if the value of a nearby frequency to be explored is higher than the upper limit of the frequency band to be explored;

a second group of receivers is dedicated to a task of analysis of the frequencies in the list of service-carrier frequencies, an analysis task instance fills a table of services, the analysis task instances are synchronised with one another via a second semaphore protecting an identifier of a nearby frequency to be analysed, and an analysis task instance stops if the list of service-carrier frequencies is empty and if the value of the next frequency to be explored is higher than the upper limit of the frequency band;

to create task instances according to the distribution of receivers, wherein each distributed receiver is associated with a task according to its group, and the task instances are performed in parallel;

to provide the service table produced to update the configuration memory.

11. The device according to claim 10, wherein device is a decoder unit.

* * * * *